United States Patent [19]

Blankinship Andrew B.

[11] Patent Number: 4,763,012

[45] Date of Patent: Aug. 9, 1988

[54] EQUALIZER QUICK SWITCH

[76] Inventor: Blankinship Andrew B., 11 Bumgarner Dr., Forest, Va. 24551

[21] Appl. No.: 25,158

[22] Filed: Mar. 12, 1987

[51] Int. Cl.$^4$ .............................................. H04Q 3/00
[52] U.S. Cl. ...................................... 307/43; 307/112; 358/181; 381/123; 340/825.25; 369/5
[58] Field of Search ....................... 307/43, 50, 34, 35, 307/37, 38, 39, 40, 41, 112, 113, 114, 115, 125, 139, 140; 340/825.01, 806, 825, 825.25, 825.39, 825.66, 825.03, 870.16, 870.17, 310 R; 200/1, 5, 16 C, 16 D, 16 F, 153 S, 82 R, 81 H; 361/166, 168.1, 171, 172, 170; 381/102, 123, 80, 81; 174/139 R; 369/2, 5, 6, 7, 30, 252; 358/181, 93, 189, 335, 144; 455/181, 186, 135, 142, 143; 360/72.2, 78.99, 72.3, 86

[56] References Cited

U.S. PATENT DOCUMENTS

| | | | |
|---|---|---|---|
| 2,846,514 | 8/1958 | Byrd | 381/123 X |
| 2,971,135 | 2/1961 | Ebert | 307/38 X |
| 3,461,444 | 8/1969 | Eisele | 340/332 |
| 3,922,641 | 11/1975 | Gates | 340/825.03 |
| 3,952,154 | 4/1976 | Gates | 381/123 |
| 4,006,306 | 2/1977 | Driscoll | 369/5 X |
| 4,176,251 | 11/1979 | Odlen et al. | 381/123 X |
| 4,217,573 | 8/1980 | Norris | 340/825.25 |
| 4,306,114 | 12/1981 | Callahan | 381/119 |
| 4,435,845 | 3/1984 | Timm et al. | 381/123 X |
| 4,481,660 | 11/1984 | Koning et al. | 381/81 X |
| 4,525,820 | 6/1985 | Enoki et al. | 381/123 X |
| 4,581,645 | 4/1986 | Beyers | 358/181 |
| 4,638,181 | 1/1987 | Deiss | 358/181 X |
| 4,647,973 | 3/1987 | Deiss | 358/181 |

Primary Examiner—William M. Shoop, Jr.
Assistant Examiner—Paul Ip
Attorney, Agent, or Firm—Richard L. Miller

[57] ABSTRACT

An equalizer quick switch is provided which provides a switching interface between multichannel input signal sources, an equalizer, and a multichannel amplifier with multiple inputs. In one embodiment the switching is performed by manually operated switches. In another embodiment, the switching is performed automatically when the input sources are switched on. This is accomplished using current sensing on the input power mains, and a logic switch matrix employing either buffers and inverters or, alternatively, a diode switching matrix.

6 Claims, 1 Drawing Sheet

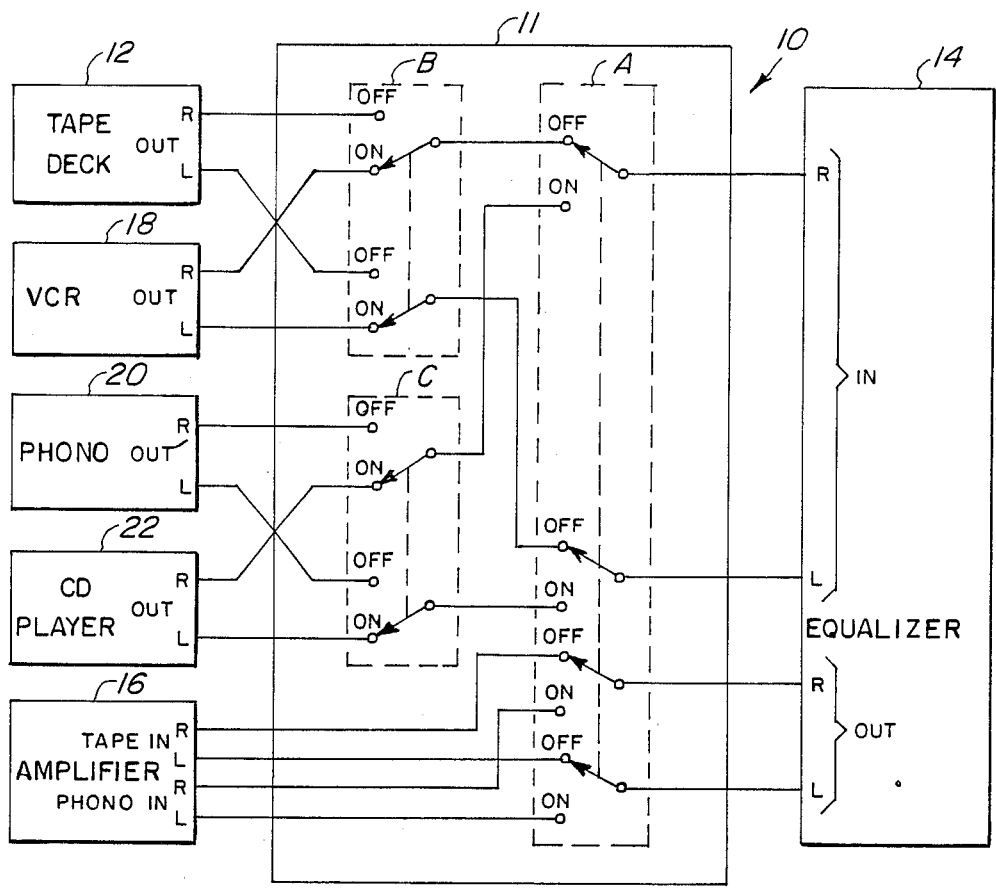
Fig. 1
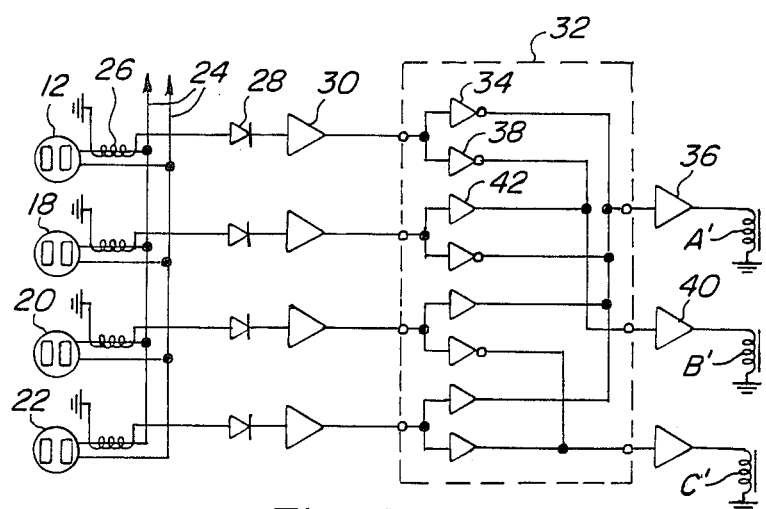
Fig. 2
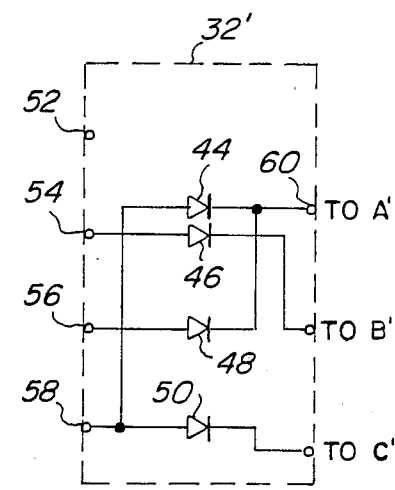
Fig. 4
| TRUTH TABLE | | | | |
|---|---|---|---|---|
| | A | B | C | |
| TAPE DECK | 0 | 0 | X | 0 = OFF |
| VCR | 0 | 1 | X | 1 = ON |
| PHONO | 1 | X | 0 | X = NO EFFECT |
| CD PLAYER | 1 | X | 1 | |
Fig. 3

EQUALIZER QUICK SWITCH

BACKGROUND OF THE INVENTION

The present invention relates generally to the field of electrical switching devices, and, more specifically, to switching systems which allow several multichannel signal sources to switchably share an equalizer connected to an amplifier with multiple input source options.

At the present time an audio system user must manually change patch cord connections between several equalizer input sources and multiple amplifier input source options. In one such setup a phonograph turntable may be the input source to the equalizer while the output of the equalizer is connected to the amplifier phono input. The use of a tape deck will require that the tape deck output be connected to the input of the equalizer while the output of the equalizer must be connected to the tape input of the amplifier. Switching from phono to tape therefore requires the manual re-patching of both equalizer input and output connections.

A number of control switching devices have been proposed including D. Khatri's Touch-Operated Power Control Device (U.S. Pat. No. 4,535,254), and S. Manley's Audio Component Coupler (U.S. Pat. No. 4,437,018). However, both inventions apply only to power switching, not to switching inputs and outputs of intermediary equalizing devices, and therefore do not provide solutions to the equalizer switching dilemma.

SUMMARY OF THE INVENTION

It is, therefore, a primary object of the present invention to provide an equalizer quick switch which can allow the user to switchably select a multichannel input source device to automatically connect the selected source to the input of an equalizer and simultaneously direct the output of the equalizer to the appropriate input of an amplifier.

Another object is to provide an equalizer quick switch in which this switching is performed using manual switches.

A further object is to provide an equalizer quick switch in which this switching is performed automatically when the power to an input signal source is turned on. This is accomplished by replacing the manual switches with relays which are activated by logic circuitry energized from signals derived by sensing the power supply current.

Further objects of the invention will appear as the description proceeds.

To the accomplishment of the above and related objects, this invention may be embodied in the form illustrated in the accompanying drawings, attention being called to the fact, however, that the drawings are illustrative only and that changes may be made in the specific construction illustrated and described within the scope of the appended claims.

BRIEF DESCRIPTION OF THE DRAWING FIGURES

The figures in the drawings are briefly described as follows:

FIG. 1 is a schematic diagram of a manual version of the invention.

FIG. 2. is a schematic diagram of additional circuitry required in order that the invention be automatically responsive to whichever input signal component is turned on by the user.

FIG. 3 is a truth logic table which applies to all of the embodiments.

FIG. 4 is a diagram of alternate circuitry to be substituted in FIG. 2 illustrating another embodiment.

DETAILED DESCRIPTION OF THE PREFERRED EMBODIMENTS

The basic operation of a system 10 incorporating the invention 11 may best be understood with reference to FIG. 1 and the truth table in FIG. 3, which illustrates the switching logic to be accomplished between various input ports and outport of the instant invention 11. In truth table FIG. 3 a 0, or off, indicates that a switch toggle is in the up position, while a 1, or on, indicates that a switch toggle in the down position as viewed in FIG. 1. In order to use tape deck 12, the switches are set as follows: A=off, B=off, C=no effect. Signal flow is as follows: output of tape deck 12, switch B, switch A, equalizer 14, switch A, tape input of amplifier 16. In order to use VCR 18, the switches are set as follows: A=off, B=on, C=no effect. Signal flow is as follows: output of VCR 18, switch B, switch A, equalizer 14, switch A, tape input of amplifier 16. In order to use phono 20, the switches are set as follows: A=on, B=no effect, C=off. Signal flow is as follows: phono 20, switch C, switch A, equalizer 14, switch A, phono input of amplifier 16. In order to use CD player 22, the switches are set as follows: A=on, B=no effect C=on. Signal flow is as follows: CD player 22, switch C, switch A, equalizer 14, switch A, phono input of amplifier 16.

FIG. 2 illustrates an embodiment of the equalizer quick switch in which switching is performed automatically when either of the input devices 12, 18, 20, or 22 are switched on. The circuitry of FIG. 1 is used in its entirety, except that the manually operated switches A, B, and C are replaced by solenoid activated relays A', B', and C'. When tape deck 12 is turned on it receives power via power mains 24 which induces an alternating current voltage in the secondary of current transformer 26. This current is rectified by rectifier 28 and further amplified by operational amplifier 30 at whose output is a logical 1. The logic matrix 32 operates upon this signal as follows: inverter 34 produces a 0 at relay driver 36 turning relay A' off, and inverter 38 produces a 0 at relay driver 40 turning relay B' off. For tape deck operation relay C' has no effect. It can easily be shown that turning on any of the input signal sources produces the same result as manually operating the switches as in FIG. 1.

In FIG. 4 the logic matrix 32 of FIG. 2 which contained inverters such as 34 and buffers such 42 has been replaced by logic matrix 32' which uses diode switching instead. The diodes 44, 46, 48, and 50 steer the logical 1s to the appropriate relay drivers while blocking feedback of 1's back to the inputs of the switching matrix. For example when phono 20 is used, the inputs at terminals 52, 54, and 58 are logical 0s, and terminal 56 is a logical 1. Diode 48 conducts the 1 to terminal 60 which ultimately turns relay A' on while diode 44 blocks the 1 from being fed back to terminal 58. It can be easily demonstrated, then, that the effect of using the diode matrix for switching matrix 32' is the same as using inverter and buffer switching matrix 32.

While certain novel features of this invention have been shown and described and are pointed out in the annexed claims, it will be understood that various omissions, substitutions and changes in the forms and the details of the device illustrated and in its operation can be made by those skilled in the art without departing from the spirit of the invention.

What is claimed is:

1. An equalizer quick switch comprising:
    (a) at least two multichannel electrical output ports for source devices;
    (b) a set of input and output ports for a multichannel frequency equalizer;
    (c) at least one input port for a multichannel amplifier;
    (d) a multipath wiring arrangement between the input and output ports; and
    (e) switching means in said multipath wiring for selectively switching said output port for said source devices to an input port for said equalizer while simultaneously switching an output port for said equalizer to the appropriate input ports for said multichannel amplifier.

2. An equalizer quick switch, as recited in claim 1, wherein said switching means comprises multiple pole multiple throw switches interposed between said electrical output ports for said source devices and said input ports for said equalizer and also interposed between said output ports for said equalizer and said O-input ports for said multichannel amplifier.

3. An equalizer quick switch, as recited in claim 2, wherein said multiple pole multiple throw switches are mechanically activated.

4. An equalizer quick switch, as recited in claim 2, wherein said multiple pole multiple throw switches are electrical relays together with relay activation means for the automatic operation of said relays when mains power is supplied to one of said source devices.

5. An equalizer quick switch, as recited in claim 2, wherein said relay activation means comprises a current transformer attached to the power mains source of each input device, whereby, when said source device is turned on, an alternating current signal is induced in the secondary of said current transformer; a rectifying means for converting said alternating current to direct current, an operational amplifier for amplifying said direct current, a switching matrix using buffers and inverters whose outputs correspond to appropriate relays, and output drivers for amplifying the output levels of said switching matrix sufficiently to drive said relays.

6. An equalizer quick switch, as recited in claim 2, wherein said relay activation means comprises a current transformer attached to the power mains input of each input device, whereby, when said source device is turned on, an alternating current signal is induced in the secondary of said current transformer; a rectifying means for converting said alternating current to direct current, an operational amplifier for amplifying said direct current, a diode switching matrix whose outputs correspond to appropriate relays, and output drivers for amplifying the output levels of said switching matrix sufficiently to drive said relays.

* * * * *